United States Patent [19]

Yamamoto et al.

[11] Patent Number: 4,701,709

[45] Date of Patent: Oct. 20, 1987

[54] NMR IMAGING METHOD

[75] Inventors: Etsuji Yamamoto, Akishima; Hideki Kohno, Tokyo; Ryuzaburo Takeda, Mito, all of Japan

[73] Assignee: Hitachi, Ltd., Tokyo, Japan

[21] Appl. No.: 766,195

[22] Filed: Aug. 16, 1985

[30] Foreign Application Priority Data

Aug. 17, 1984 [JP] Japan .................. 59-170413

[51] Int. Cl.[4] ............... G01R 33/20; G01N 24/08
[52] U.S. Cl. .................... 324/312; 324/309; 324/308
[58] Field of Search ............... 324/300, 307, 309, 308, 324/312

[56] References Cited

U.S. PATENT DOCUMENTS 4,579,121  4/1986  Macovski .............. 324/309 X
4,591,789  5/1986  Glover et al. .......... 324/307
4,604,579  8/1986  Cannon et al. ......... 324/309

FOREIGN PATENT DOCUMENTS 0145276  6/1985  European Pat. Off. ...... 324/307

OTHER PUBLICATIONS

T. Inouye et al., A Method for $T_1$ Relaxation Time Computed Images, Society of Mag. Res. in Medicine, 2nd Annual Meeting, San Francisco, Aug. 1983.

T. Inouye et al., Experimental Results with a Whole Body NMR-CT Scanner Using a Resistive Magnet, Radiation Medicine, vol. 1, No. 1, Jan. 1983.

T. Redpath, Calibration of the Aberdeen NMR Imager for Proton Spin-Lattice Relaxation Time Measurement in Vivo, Phys. Med. Biol., vol. 27, No. 8, 1982.

Primary Examiner—Stewart J. Levy
Assistant Examiner—Scott M. Oldhom
Attorney, Agent, or Firm—Antonelli, Terry & Wands

[57] ABSTRACT

An NMR imaging method for measuring a magnetization distribution of an article under test, particularly the magnetization distribution including a longitudinal relaxation effect, by a Fourier imaging method with identification of polarity of the magnetization distribution.

A homogeneous phantom is measured by the Fourier imaging method and image-reconstructed so that a reference image data which reflects a phase rotation inherent to an NMR imaging apparatus is obtained. Then, a magnetization distribution of an article under test is obtained in a similar measurement and image reconstruction sequence, and products of the reference image data and the image data of the article under test are stored as the signs to represent the polarity of magnetization of the article under test.

8 Claims, 9 Drawing Figures

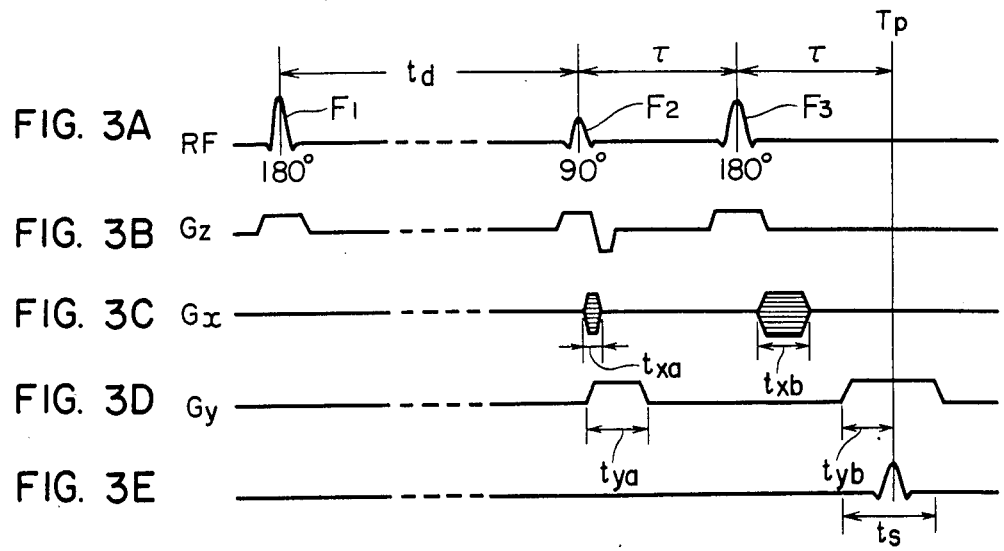
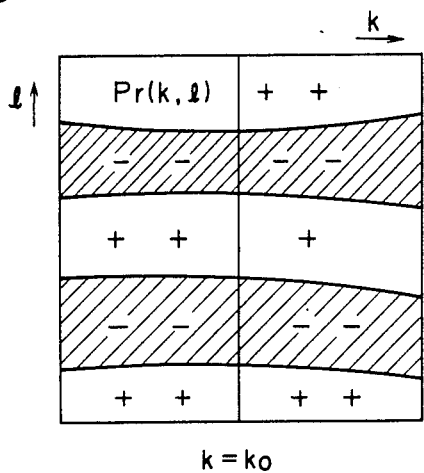

NMR IMAGING METHOD

BACKGROUND OF THE INVENTION

The present invention relates to a method for obtaining a magnetization distribution image of a living body by measuring nuclear magnetic resonance signals such as those of hydrogen or phosphorus in a living body.

In an imaging apparatus which uses a nuclear magnetic resonance (NMR) phenomenon, it is necessary to separate and identify NMR signals from an article under test for each portion of the article. As one method therefor, a gradient magnetic field is applied to the article under test to generate different magnetic field intensities in which the portions of the article are placed which causes differences among resonance frequencies or amounts of phase encoding of the portions of the article so that positional information is obtained.

The latter is called a Fourier imaging method which is presently widely used. In this method, a Fourier transform is carried out in two stages (two-dimensional Fourier transform) or three stages (three-dimensional Fourier transform). There are two methods for displaying a magnetization distribution of the article under test. In one method, only real parts or imaginary parts of the result of reconstruction of an image obtained as complex numbers are displayed, and in the other method, absolute values of the result are displayed. In the former method, if there is a shift in start time of signal sampling, dark and light areas appear in an image. Accordingly, it is necessary to adjust timing of application of the gradient magnetic field or start timing of sampling prior to the measurement. In the latter method, the dark and light areas do not appear because of the absolute values and the level of background noise of the image can be set to the lowest level.

The magnetization distribution image usually represents a density distribution of a nuclear seed (e.g. hydrogen) under consideration. By improving a measurement sequence, the magnetization distribution image can represent a spin distribution image weighted by longitudinal relaxation time $T_1$ of the nuclear seed ($T_1$ enhanced image). From data of two magnetization distribution images having different longitudinal relaxation effects, $T_1$ values at respective coordinates can be calculated and $T_1$ distribution image can be obtained, as taught by PHYSICS IN MEDICINE AND BIOLOGY, Vol. 27, No. 8, pp 1057-1065 (1982). However, when those two magnetization distribution images are displayed by absolute values, an exact $T_1$ value cannot be calculated unless the polarity of magnetization is anticipated because the positive magnetization and the negative magnetization are not distinguishable.

SUMMARY OF THE INVENTION

It is an object of the present invention to provide an NMR imaging method capable of exactly detecting polarities of magnetization at respective coordinates of a magnetization distribution image represented by absolute values.

It is another object of the present invention to provide an NMR imaging method capable of exactly detecting polarities of magnetization irrespective of a phase shift caused by factors inherent to an apparatus.

It is another object of the present invention to provide an NMR imaging method capable of readily detecting a distribution of longitudinal relaxation time $T_1$ of an article under test.

In accordance with the present invention, there is provided an NMR imaging method comprising the steps of measuring a magnetization distribution of homogeneous phantom by a Fourier imaging method sequence, storing real parts or imaginary parts (or signs of the former or the latter) of reconstructed image data of complex numbers in a first memory, measuring a magnetization distribution of an article under test by a similar Fourier imaging method sequence, storing real parts or imaginary parts (or signs of the former or the latter) and absolute values of the reconstructed image data in second and third memories, respectively, determining signs of products of data at respective coordinates in the first and second memories, and storing the signs of the products at respective coordinates in the third memory as signs of the image data to be displayed by the absolute values.

BRIEF DESCRIPTION OF THE DRAWINGS

FIGS. 3A to 3E are diagrams showing waveforms of a measuring pulse sequence of a Fourier imaging method, FIG. 5 is a conceptual view showing a phase shift inherent to an NMR imaging apparatus.

DESCRIPTION OF THE PREFERRED EMBODIMENT

Prior to the explanation of the embodiment of the present invention, status of magnetization relaxation and a method for measuring a longitudinal relaxation time are provided.

Figure 1:
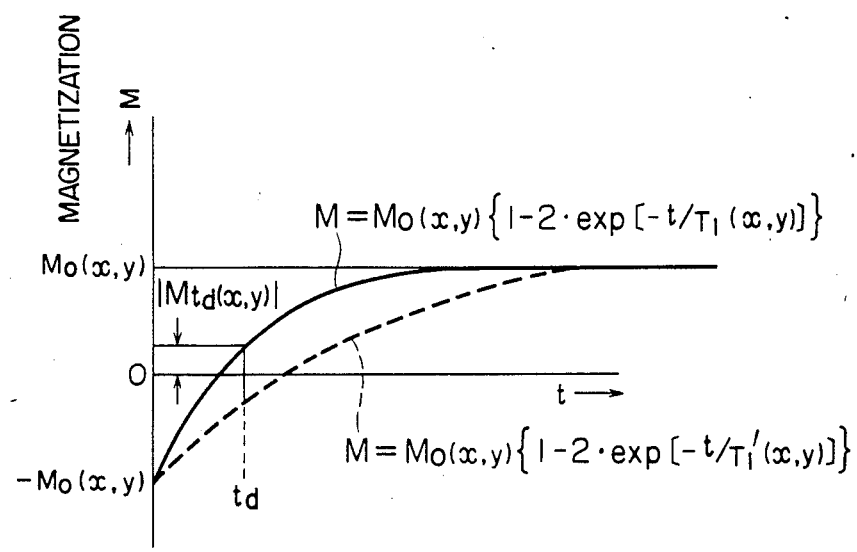
FIG. 1 shows a magnetization relaxation curve.

When a magnetization $M_o$ is reversed at time $t=0$ in a constant magnetic field, the magnetization recovers from $-M_o$ toward $M_o$ in accordance with $$M = M_o[1 - 2 \cdot \exp(-t/T_1)] \quad (1)$$

where $T_1$ is the longitudinal relaxation time. In FIG. 1, a magnetization $M_o(x, y)$ at coordinate $(x, y)$ of an article under test and a magnetization $M_{td}(x, y)$ at time $t = t_d$ are measured to calculate $T_1$. However, if the magnetization $M_{td}(x, y)$ is measured by a Fourier imaging method to obtain an absolute value $$|M_{td}(x, y)| \quad (2)$$

a polarity of magnetization cannot be identified and it is not possible to determine whether a relaxation shown by a solid line in FIG. 1 occurred, that is whether the longitudinal relaxation time at point $(x, y)$ is $T_1(x, y)$, or a relaxation shown by a broken line occurred, that is, the longitudinal relaxation time at point $(x, y)$ is $T_1'(x, y)$. In the present invention, a sign indicating a polarity of magnetization is added to the absolute value data of magnetization distribution.

Figure 2:
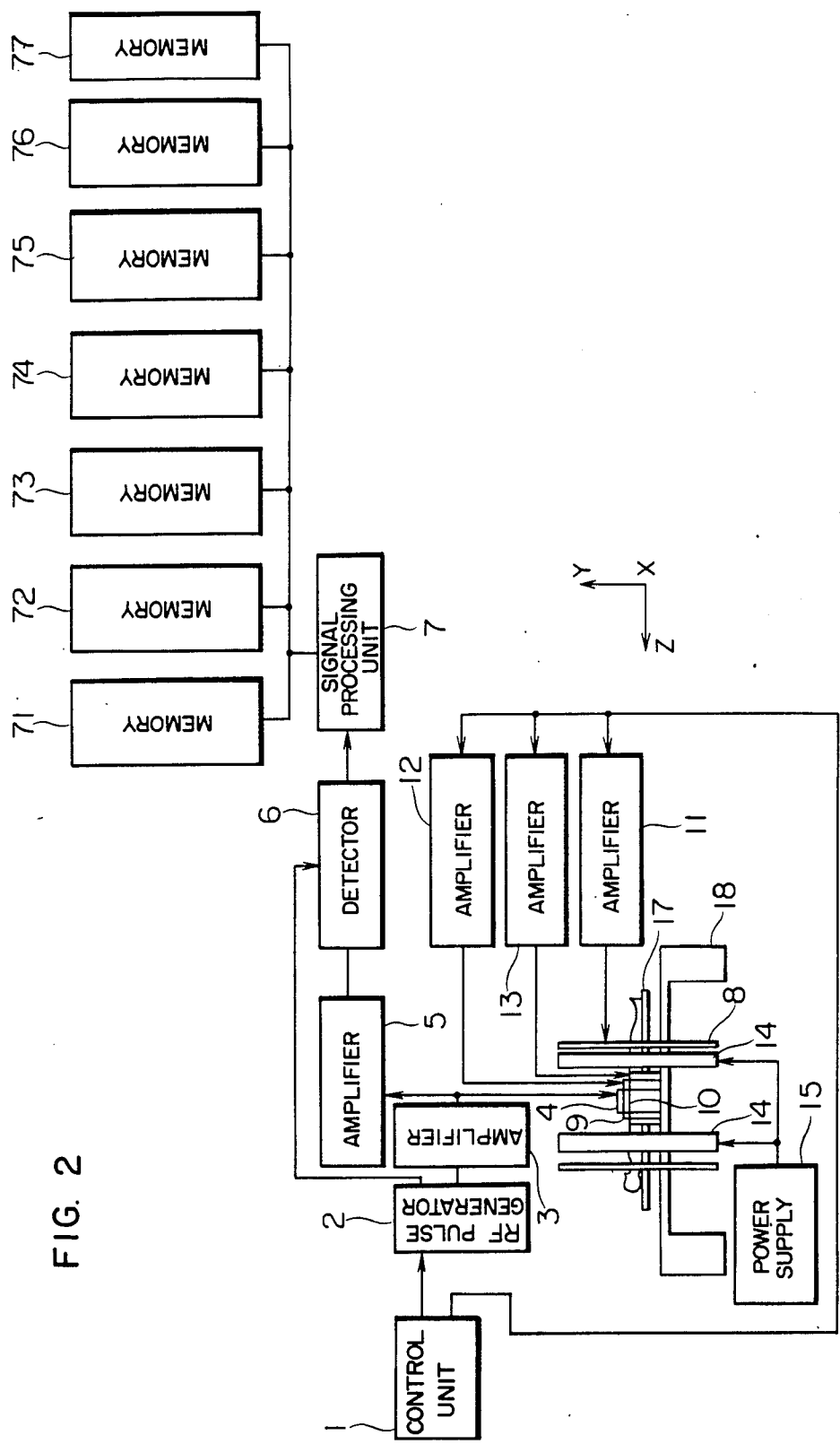
FIG. 2 is a block diagram showing an embodiment of the present invention.

An embodiment of the present invention is now explained with reference to the drawing. FIG. 2 shows a configuration of an imaging apparatus of one embodiment of the present invention.

A control unit 1 issues various commands to other units at a fixed timing. An output from an RF pulse generator 2 is amplified by an amplifier 3, an output of which excites a coil 4. The coil 4 also serves as a receiving coil, and a received signal component is supplied to an amplifier 5, detected by a detector 6 and converted to an image signal by a signal processing unit 7. Numerals 71, 72, 73, 74, 75, 76 and 77 denote memories used for image processing. The output from the R.F. pulse generator 2 is also used as a reference signal for a quadrature phase detection in the detector 6. Gradient magnetic fields $G_z$, $G_x$ and $G_y$ in z, x and y directions are generated by coils 8, 9 and 10, respectively, which are excited by amplifiers 11, 12 and 13, respectively. A uniform static magnetic field $H_o$ in the Z direction is generated by a coil 14 which is excited by a power supply 15.

A human body 16 under test is placed on a bed 17 which is moved on a support table 18.

FIGS. 3A to 3D show a measuring pulse sequence of the Fourier imaging method used in the present embodiment. FIG. 3A shows an R.F. pulse, FIG. 3B shows the gradient magnetic field $G_z$ in the Z direction, FIG. 3C shows the gradient magnetic field $G_x$ in the X direction, FIG. 3D shows the gradient magnetic field $G_y$ in the Y direction, and FIG. 3E shows a spin echo waveform derived from this sequence. First, $G_z$ of a predetermined strength is applied and a 180° R.F. pulse $F_1$ is generated to reverse magnetization in a slice which is normal to a Z axis of the article under test. After a time period td, $G_z$ is applied and a 90° R.F. pulse $F_2$ is generated. After a time period $\tau$, $G_z$ is applied and a 180° R.F. pulse $F_3$ is generated to obtain a spin echo. The signal is sampled during a time period $T_s$ for which the gradient magnetic field $G_y$ is applied. Since the gradient magnetic field $G_y$ is also applied in a time period tya prior to the generation of the 80° R.F. pulse $F_3$, a peak of the spin echo appears at a time point Tp at which a phase dissipation by $G_y$ in the period $t_{ya}$ is cancelled by $G_y$ in the period $t_{yb}$. The timing of $G_y$ is controlled such that the time point Tp corresponds to $\tau$ later than the center of the 180° R.F. pulse $F_3$. On the other hand, in the periods $t_{xa}$ and $t_{ya}$ prior to $t_s$, the gradient magnetic field $G_x$ is applied to encode the X direction positional information into a spin phase. The above sequence is repeated by $N_x$ times for $N_x$ different strengths of $G_x$.

For the series of data thus obtained, two-dimensional discrete Fourier transform is carried out to reconstruct image data which represent the magnetization distribution in the slice. This magnetization distribution is one at a time point which is $t_d$ later than the reversal of magnetization and it is called a $T_1$ enhanced image because it contains a longitudinal relaxation effect of magnetization.

The result of the two-dimensional Fourier transform is given by a complex number. As described above, identification of polarity is required for the measurement of $T_1$. However, the result of the Fourier transform of the data obtained by the above measurement sequence contains a phase shift due to factors inherent to the apparatus such as a shift of sampling timing or a shift of control timing of the gradient magnetic field. Accordingly, if only the article under test is imaged, the polarity of magnetization of the article under test cannot be identified.

More specifically, the result of the Fourier transform is given by the following complex number $$\text{Re } (k, l) + j \text{ Im } (k, l) \tag{3}$$

The magnetization distribution $\rho$ (k, l) to be measured is represented by $$\text{Re } (k, l) = A\rho(k, l) \cos \theta \tag{4}$$

$$\text{Im } (k, l) = A\rho (k, l) \sin \theta \tag{5}$$

where A is a proportional constant, and $\theta$ is the phase shift caused by the shift of the signal sampling timing or the gradient magnetic field control timing. For a pixel (k, l), $$\theta(k, l) = \gamma \Delta t \int_0^k G(k, l) dk \tag{6}$$

where $\gamma$ is a nuclear gyromagnetic ratio, G is a gradient magnetic field applied when the signal is to be detected, and $\Delta t$ is a time difference between a signal peak and a center of sampling. It is assumed that G is directed to a direction of change of k.

From the equations (4) and (5), $|A_\rho (k, l)|$ is calculated by $$[\{\text{Re } (k, l)\}^2 + \{\text{Im } (k, l)\}^2]^{\frac{1}{2}} \tag{7}$$

Thus, an absolute value of the Fourier transformed data is $|A_\rho (k, l)| \uparrow$. However, the sign information has been lost. The sign information is necessary to calculate the $T_1$ image. The sign information cannot be distinguished from a positive or negative sign given by $\theta$ in the equation (6).

Figure 4:
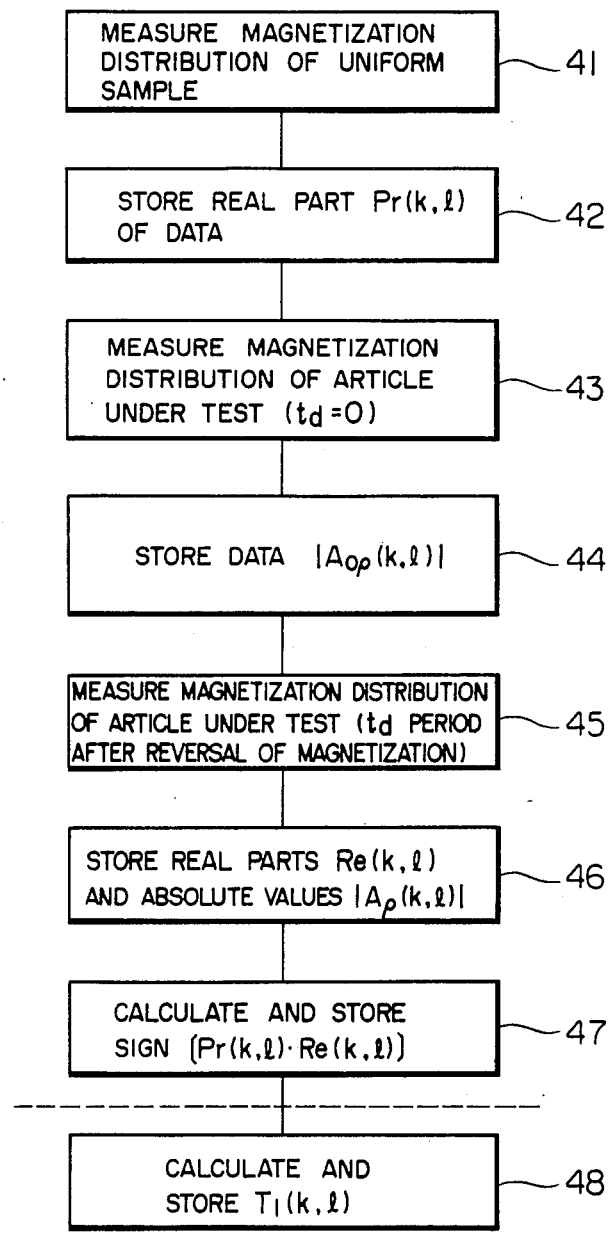
FIG. 4 is a flow chart of the embodiment of the present invention.

In the present embodiment, the sign of magnetization is determined in accordance with a flow shown in FIG. 4. A homogeneous phantom, for example, a vessel filled with water is placed in the coils 8, 9 and 10 and the magnetization distribution thereof is measured (FIG. 4, step 41). Specifically, the signal is measured from the sequence shown in FIGS. 3A–3E excluding the 180° R.F. pulse $F_1$ and $G_z$ applied simultaneously therewith, and the resulting sampling data is stored in the memory 71. The data is then loaded to the signal processing unit 7 to reconstruct the magnetization distribution image by the two-dimensional Fourier transform. In a step 42 of FIG. 4, a real part Pr (k, l) of the result is stored in the memory 72. A sign of Pr (k, l) reflects the phase shift in the equation (6), that is, the phase shift due to the factors inherent to the apparatus such as the gradient magnetic field control timing or the sampling timing.

It is preferable to previously eliminate an offset phase shift $P_o$ which is independent from the pixel position (k, l). To this end, the phase of the reference R.F. signal used in the quadrant detector 6 is adjusted or real parts and imaginary parts of the image data of the phantom are arithmetically compensated, such that an integral of a certain area of projection derived from a first Fourier transform of the sampling signal when the encoding gradient magnetic field $G_x$ is zero is rendered maximum.

Namely, $\theta_o$ is determined to give a maximum integration of the real part of the following expression $$\{P_1 (k, l) + j P_2 (k, l)\} e^{j\theta_o} \tag{8}$$

where $P_1$ (k, l) and $P_2$ (k, l) are real parts and imaginary parts of the first Fourier transform result of a certain area. $\theta_o$ is a phase constant which is determined by the phase relationship between the reference signal of the quadrant detection and the R.F. pulses $F_1$–$F_3$ and is independent from the position of the pixel.

In a step 43 of FIG. 4, the article under test (human body) is placed in the coils and the magnetization distribution of a desired slice thereof without the relaxation effect is measured. Specifically, the series of sampling data is obtained in the sequence of FIGS. 3A–3E again excluding 180° R.F. pulse F₁ and $G_z$ applied simultaneously therewith, and it is stored in the memory 71 and then two-dimensional Fourier transformed by the signal processing unit 7 to reconstract the magnetization distribution image. In a step 44, absolute values $|A_{op}(k, l)|$ are calculated by the formula (7) and they are stored in the memory 73.

In the step 43, the phase of R.F. signal used in the quadrant detector 6 is again adjusted so as to cancel the offset phase shift $P_o$. The cancellation of $P_o$ can also be practiced by an arithmetical compensation as is mentioned in the explanation of the the step 41. In the latter case, the data for compensation is stored in the memory 74 so that the data can be again used in the step 45.

In the step 45, a $T_1$ enhanced magnetization distribution of the article under test is measured. Specifically, the series of sampling data as to the same slice of the article as is measured in the step 43 is obtained in the sequence of FIGS. 3A–3E including 180° R.F. pulse and $G_z$ applied simultaneously therewith, and it is stored in the memory 71. The data is two-dimensional Fourier transformed.

In the step 46, the real parts Re (k, l) of the result of the Fourier transformation are stored in the memory 75. The absolute values $|A_\rho(k, l)|$ of the result are calculated by the formula (7) and they are stored in the memory 76. The memory 76 has bit positions to store the absolute value of measured magnetization as well as the sign thereof. In the step 45, it is also preferable to eliminate the offset phase shift $P_o$ which is independent from the pixel position (k, l). In the case where the reference R.F. signal is adjusted in the step 43, the step 45 is free from the offset phase shift. On the other hand, in the case where $P_o$ is cancelled through the arithmetical compensation in step 43, the complex data obtained by Fourier transformation in the step 45 should be again compensated by using data stored in memory 74. Through the measurement and processing, the magnetization distribution image ($T_1$ enhanced image) which includes the relaxation effect by the time $t_d$ of the article under test is attained. However, sign of Re (k, l) reflects both the polarity of magnetization and the phase shift by the factors inherent to the apparatus.

In a step 47 of FIG. 4, Pr (k, l) in the memory 72 and Re (k, l) in the memory 75 are sequentially loaded to the signal processing unit 7, and a product thereof is calculated for each pixel (k, l), and a sign of the product, sign [Pr (k, l)·Re (k, l)] is stored in the memory 76 as the sign which represents the polarity of the magnetization distribution $|A_\rho(k, l)|$.

In this manner, the image data representing the $T_1$ enhanced image of the specific slice of the article under test, which is represented by the absolute value and the sign indicating the polarity is stored in the memory 76. By displaying the content of the memory 76 on the CRT display, the image which exactly reflects the relaxation effect is displayed.

In the present embodiment, the sign of the magnetization distribution of the article under test is obtained on the assumption that the phase rotation inherent to the apparatus due to the shift of sampling time during the measurement of the homogeneous phantom and the phase rotation during the measurement of the article under test are equal. Accordingly, the sampling time in the measurement of the phantom must be equal to the sampling time in the measurement of the article under test although the sequence thereof is not important.

In the present embodiment, only the signs of Pr (k, l) and Re (k, l) are important. Accordingly, in the step 46 of FIG. 4, only the sign of Pr (k, l), sign [Pr (k, l)] may be stored in the memory 72 and only the sign of Re (k, l), sign [Re (k, l)] may be stored in the memory 75.

Because the spin density and the $T_1$ enhanced image of the article under test together with the sign indicating the polarity of magnetization are obtained, the distribution of $T_1$ can be calculated. Step 48 in FIG. 4 shows measurement and processing flow therefor.

The $T_1$ enhanced image data stored in the memory 76 in the step 47 is expressed by $$A_\rho(k, l) = A_{op}(k, l) \{1 - 2\cdot\exp[-t_d/T_1(k, l)]\} \qquad (9)$$

Accordingly, in a step 48, the data in the memory 73 and the data in the memory 76 are read out and the longitudinal relaxation time $T_1$ (k, l) is calculated by $$T_1(k, l) = -t_d/\ln\left[\frac{A_{op}(k, l) - A_\rho(k, l)}{2A_{op}(k,l)}\right] \qquad (10)$$

and it is stored in the memory 77. In this manner, the $T_1$ distribution image is stored in the memory 77.

The $T_1$ distribution image including the $T_1$ enhanced image and the spin density image has been described above. In the sequence of FIGS. 3A to 3E, different times $t_d$ may be used to produce two $T_1$ enhanced images and the $T_1$ distribution image may be obtained from those data. In this case, the sign indicating the polarity of magnetization described in the step 47 of FIG. 4 must be calculated when the second $T_1$ distribution image is produced.

In the embodiment of FIG. 4, the data Pr (k, l) which reflects the phase rotation by the factors inherent to the apparatus is obtained for each pixel (k, l), and the data or the sign thereof is stored in the memory 71. The phase rotation usually appears along the direction (direction k in the pixel plane) of the gradient magnetic field $G_y$ applied when the signal is sampled. Accordingly, in the step 42 of FIG. 4, instead of calculating Pr (k, l) for all of the pixels (k, l), Pr (k, 1) (where k=k₀) of only one line along the direction of the gradient magnetic field $G_y$ may be calculated and the sign of $|A_{op}(k, l)|$ may be determined by the sign of Pr (k, l). In this case, it is desirable to use Pr (k, l) on the center line of the view field as shown by a line k=k₀ in FIG. 5.

In the sequence shown in FIGS. 3A–3E, the sampling timing and the gradient magnetic field control timing may be adjusted to make the phase rotation inherent to the apparatus zero so that the polarity of magnetization can be identified without imaging the homogeneous phantom. Namely, the magnetization distribution of the article under test is measured, the image is reconstructed by the Fourier imaging method and the real part Re (k, l) of the result is used as the sign to represent the polarity of magnetization.

We claim:
1. An NMR imaging method comprising the steps of:
   (a) measuring a magnetization distribution of a homogeneous phantom by a first sequence of a Fourier imaging method, and storing real parts, imaginary parts or the signs thereof of image-reconstructed data thus measured into a first memory;

(b) measuring a magnetization distribution of an article under test by a second sequence of a Fourier imaging method and storing real parts, imaginary parts or the signs thereof and absolute values of image-reconstructed data thus measured into second and third memories, respectively; and (c) multiplying at respective coordinates the real part, imaginary part, or the sign thereof, of the data stored in said first memory by the real part, imaginary part, or the sign thereof, of the data stored in said second memory, and storing the signs at the respective coordinates in said third memory as the signs of the image reconstructed data represented by the absolute values in said third memory.

2. An NMR imaging method according to claim 1 wherein the measurement of magnetization distribution of the article under test is a measurement of the magnetization distribution including a relaxation effect of magnetization.

3. An NMR imaging method according to claim 1 wherein said first sequence comprises the steps of applying a 90° R.F. pulse and a 180° R.F. pulse to obtain a spin echo, applying a first gradient magnetic field for phase encoding, and sampling a signal while a second gradient magnetic field orthogonal to the first gradient magnetic field is applied, and said steps of the first sequence are repeated a plurality of times with different strengths of the first gradient magnetic field.

4. An NMR imaging method according to claim 1 wherein said second sequence comprises the steps of applying a 90° R.F. pulse and a 180° R.F. pulse for obtaining a spin echo, applying a first gradient magnetic field for phase encoding, sampling a signal while a second gradient magnetic field orthogonal to said first gradient magnetic field is applied, and applying a second 180° R.F. pulse for reversing magnetization prior to the application of the 90° R.F. pulse, and said steps in the second sequence are repeated a plurality of times with different strength of said first gradient magnetic field.

5. An NMR imaging method according to claim 3 wherein said first memory stores therein real parts, imaginary parts or the signs thereof of data in an area along the direction of the second gradient magnetic field.

6. An NMR imaging method according to claim 3 wherein said first memory stores therein real parts, imaginary parts or the signs thereof of data on a line crossing a center of a view field along the direction of the second gradient magnetic field.

7. An NMR imaging method according to claim 2 further comprising the steps of:

(d) measuring a second magnetization distribution image free of the relaxation effect of the magnetization of the article under test in said first sequence and storing absolute values of image-reconstructed data thus measured into a fourth memory; and (e) calculating a distribution of a longitudinal relaxation time of the article under test by the data stored in said third and fourth memories and storing the resulting distribution into a fifth memory.

8. An NMR imaging method comprising the steps of:

(a) measuring a magnetization distribution of a homogeneous phantom by a first sequence of a Fourier imaging method, and storing real parts, imaginary parts or the signs thereof of image-reconstructed data thus measured into a first memory, said first sequence of a Fourier imaging method including the steps of:

repeatedly exciting spins of particles in said phantom, applying a first gradient magnetic field for phase encoding after each step of exciting, sampling a signal from said phantom while a second gradient magnetic field is applied after each step of applying the first gradient magnetic field, and performing a Fourier transformation on data obtained by said step of sampling;

(b) measuring a magnetization distribution of an article under test by a second sequence of a Fourier imaging method and storing real parts, imaginary parts or the signs thereof and absolute values of image-reconstructed data thus measured into second and third memories, respectively, said second sequence of a Fourier imaging method including the steps of:

repeatedly exciting spins of particles in said article, which suffer a relaxation effect within a predetermined time period, applying said first gradient magnetic field for phase encoding after each time period, sampling a signal from said article while said second gradient magnetic field is applied after said step of applying the first gradient magnetic field, and performing a Fourier transformation on data obtained by said step of sampling; and (c) multiplying at respective coordinates the real part, imaginary part, or the sign thereof, of the data stored in said first memory by the real part, imaginary part, or the sign thereof, of the data stored in said second memory, and storing signs of the products at the respective coordinates in said third memory as the signs of the image data represented by the absolute values in said third memory.

* * * * *